US007102368B2

(12) United States Patent
Strom

(10) Patent No.: US 7,102,368 B2
(45) Date of Patent: Sep. 5, 2006

(54) METHOD OF APPLYING THE ANALYSIS OF SCRUB MARK MORPHOLOGY AND LOCATION TO THE EVALUATION AND CORRECTION OF SEMICONDUCTOR TESTING, ANALYSIS, AND MANUFACTURE

(75) Inventor: John T. Strom, North Bend, WA (US)

(73) Assignee: Applied Precision, LLC, Issaquah, WA (US)

( * ) Notice: Subject to any disclaimer, the term of this patent is extended or adjusted under 35 U.S.C. 154(b) by 10 days.

(21) Appl. No.: 10/788,670

(22) Filed: Feb. 27, 2004

(65) Prior Publication Data

US 2004/0227504 A1 Nov. 18, 2004

Related U.S. Application Data

(63) Continuation of application No. 10/046,559, filed on Oct. 27, 2001, now abandoned.

(60) Provisional application No. 60/244,432, filed on Oct. 30, 2000.

(51) Int. Cl.
G01R 31/02 (2006.01)
(52) U.S. Cl. .................. 324/754; 324/758; 382/151
(58) Field of Classification Search ................ 324/758, 324/158.1, 754, 765; 382/151
See application file for complete search history.

(56) References Cited

U.S. PATENT DOCUMENTS 5,657,394 A * 8/1997 Schwartz et al. ............ 382/151

* cited by examiner

Primary Examiner—Vinh Nguyen
Assistant Examiner—Jimmy Nguyen
(74) Attorney, Agent, or Firm—Pillsbury Winthrop Shaw Pittman LLP

(57) ABSTRACT

By examining scrub mark properties (such as position and size) directly, the performance of a wafer probing process may be evaluated. Scrub mark images are captured, image data measured, and detailed information about the process is extracted through analysis. The information may then be used to troubleshoot, improve, and monitor the probing process.

1 Claim, 4 Drawing Sheets

METHOD OF APPLYING THE ANALYSIS OF SCRUB MARK MORPHOLOGY AND LOCATION TO THE EVALUATION AND CORRECTION OF SEMICONDUCTOR TESTING, ANALYSIS, AND MANUFACTURE

CROSS-REFERENCE TO RELATED APPLICATIONS

The present application is a continuation of U.S. application Ser. No. 10/046,559, filed Oct. 27, 2001 now abandonment, which claims benefit of 60/244,432, filed Oct. 30, 2000, the contents of which are incorporated herein by reference.

TECHNICAL FIELD

Aspects of the present invention relate generally to semiconductor testing equipment, and more specifically, to methods of analyzing scrub marks.

BACKGROUND

A variety of equipment and techniques have been developed to assist manufacturers of integrated circuits for testing those circuits while still in the form of dies on semiconductor wafers. In order to quickly and selectively electrically interconnect metalized contact pads (also known as "bonding pads") on each die to electrical test equipment (known as a "prober machine"), arrays of slender wires or other contact media are provided. The contact media are arranged on conventional printed circuit boards so as to be positionable on the metalized contact pads associated with each semiconductor die. As is well known by those of ordinary skill in the art, those printed circuit board test cards have come to be known as "probe cards" or "probe array cards", and the contact media have come to be known as "probe card pins" or "probe pins" or "probe wires".

As the component density of semiconductor circuits has increased, the number of contact pads associated with each die has increased. It is now not uncommon for a single die to have upwards of 600 pads electrically associated with each die. The metalized pads themselves may have as little as a ten $\mu m$ gap there between with an on-center spacing on the order of 50 $\mu m$ to 100 $\mu m$. As a result, the slender probe wires of the probe array cards have become much more densely packed. It is highly desirable that the free ends or "tips" of the probes be aligned in a common horizontal plane, as well as have the proper positioning with respect to one another within the plane so that when the probes are pressed down onto the metalized pads of an integrated circuit die by a prober machine, the probes touch down substantially simultaneously, and with equal force while being on target. As used herein, the terms "touchdown", "rest" and "first contact" have the same meaning. In the process of making electrical contact with the pads, the probes are "over traveled" causing the probes to deflect from their rest position. This movement is termed "scrub" and must be taken into account in determining whether the rest position and the over travel position of the probes are within specification for the probe card.

The assignee of the present invention has developed equipment for testing the electrical characteristics, planarity and horizontal alignment, as well as scrub characteristics of various probe cards and sells such equipment under its Precision Point™ line of probe card array testing and rework stations. A significant component of these stations is a planar working surface known as a "check plate". A check plate simulates the semiconductor die undergoing a test by a probe card while checking the above described characteristics of the probes. A suitable check plate for use with the assignee's Precision Point™ equipment is described in detail in U.S. Pat. No. 4,918,374 to Stewart et al. issued Apr. 17, 1990, the disclosure of which is incorporated herein by reference. It is sufficient for the purposes of this disclosure to reiterate that while the subject probe card is held in a fixed position the check plate is moved horizontally in steps when testing the horizontal relative positioning, and vertically in steps when testing the touchdown contact and over travel position of each probe tip. Previously, and as described in the above-identified patent, horizontal position information for each probe tip was determined by translating an isolated probe tip in steps across resistive discontinuities on the check plate. In recent years, this technique has been altered by placing a transparent, optical window in the surface contact plane of the check plate with a sufficiently large surface dimension so as to permit a probe tip to reside thereon. An electronic camera viewing the probe tip through the window digitizes the initial touch down image of the probe, and a displaced position of the probes due to "scrub" as the check plate is raised to "over travel" the probe. The initial touch down position is compared to the anticipated touch down position to assist an operator in realigning that particular probe.

Another prior art technique for determining relative probe tip positions in a horizontal (e.g. X-Y) plane is described in U.S. Pat. No. 5,657,394 to Schwartz et al., the disclosure of which is incorporated herein by reference. The system disclosed therein employs a precision movement stage for positioning a video camera into a known position for viewing probe points through an optical window. Analysis of the video image and the stage position information are used to determine the relative positions of the probe points. In systems of this type, a "reference" probe position is determined primarily through information from the video camera, combined with position information from the precision stage. If the pitch of the probes on the probe card is small enough, two or more probes can be simultaneously imaged with the video camera. The position of this adjacent probe is then referenced with respect to the "reference" probe from information from the video camera only. The camera is then moved to a third probe, adjacent to the second probe and this process is repeated until each probe on the entire probe card has been imaged.

In addition to the above devices for measuring various parameters of probe cards, equipment is available for measuring actual "scrub marks" made by probe card pins on a test wafer which has been impressed by the probe card with a prober machine. One such apparatus is manufactured by Visioneering Research Laboratory, Inc., Las Cruces, N.Mex. to provide high quality imaging of scrub marks made by a probe card and a prober machine. It is well known that scrub patterns analyzed by a probe card analysis machine do not match the scrub marks produced on a test wafer imaged by a scrub mark analysis machine. The test wafer models the surface characteristics of bonding pads on a semiconductor die. As stated above, the measurement surface on the probe 15 card analyzer is typically manufactured from hardened steel, or more recently a transparent synthetic or natural crystal such as sapphire. This probe card analysis testing surface is much harder than the aluminized surface of a semiconductor bonding pad. The typical annealed aluminum surface of a semiconductor bonding pad in fact yields under pressures applied by the semiconductor probing machine which may be on the order of 5 grams per pin. Remembering that the pin surface is very small, the pressure applied is sufficient to break the surface of the aluminum bonding pad causing the probe tip to 'dig in' during probe pin overtravel. Within a short distance, the tip of the probe pin plows so deeply into the aluminum surface that it stops even though the probe card continues its downward travel. This phenomenon has been characterized as "stubbing" by the assignee of the present invention. In contrast, the hard metal or sapphire surface of the probe card analysis machine does not yield under pressure from the probe pin. In addition, the metal or sapphire contact surface of the probe card analysis machine is highly polished and has a much lower coefficient of friction than does the aluminized surface of the semiconductor die bonding pad.

As a result, the probe pin does not stub on the probe card analysis machine, and the probe pin tip travels further than it does on the aluminized bonding pad. Furthermore, the place at which the probe pin first contacts an aluminized bonding pad (or the aluminized semiconductor test wafer which simulates the bonding pad in the scrub mark analysis machine) or "touch downs" position of the probe pin is not readily discernable in the scrub mark made in the aluminum surface. The scrub mark resembles a brush stroke with a faint starting position and a deep, clearly defined ending position. Conversely, the probe card analysis machine accurately captures the touch down position of the probe pin on the measuring surface as well as its full travel across the surface without stubbing. Therefore, neither the touch down position, nor the end of travel position of the probe pin on the probe card analysis machine, matches corresponding positions on either an actual aluminum bonding pad or on a semiconductor test wafer imaged by a scrub mark analysis machine.

SUMMARY

By examining scrub mark properties (such as position and size) directly, the performance of a wafer probing process may be evaluated. Scrub mark images are captured, image data measured, and detailed information about the process is extracted through analysis. The information may then be used to troubleshoot, improve, and monitor the probing process.

DETAILED DESCRIPTION

Figure 1:
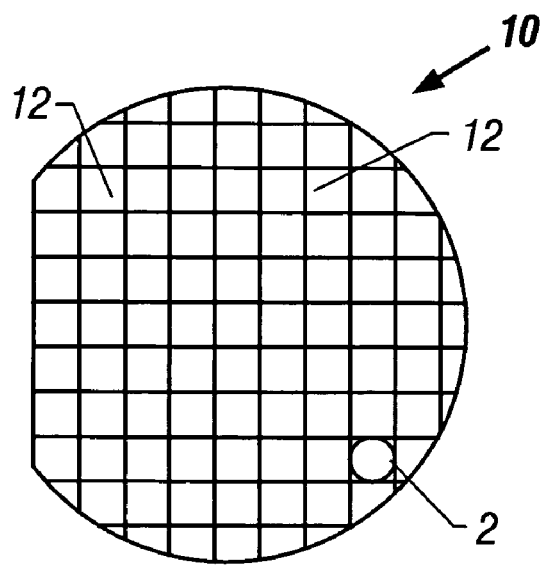
FIG. 1 is a schematic representation of a semiconductor wafer having a plurality of dies.
Figure 2:
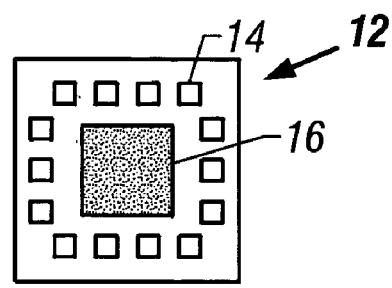
FIG. 2 is a enlarged, schematic representation of a semiconductor die indicated at circled area 2 of FIG. 1.

A semiconductor wafer is generally indicated at reference numeral 10 in FIG. 1. A semiconductor wafer has a plurality of dies 12 arranged in orthogonal rows and columns across the surface of the wafer. A conventional wafer may have a diameter of up to eight inches and anywhere from 200 up to thousands of dies per wafer depending upon the complexity of the semiconductor circuits imbedded in each die. A representative die is generally indicated at reference number 12 in FIG. 2. The die has a plurality of bonding pads 14 and a plurality of semiconductor circuits 16 surrounded by the bonding pads. The bonding pads typically have an aluminized surface which has been annealed. The bonding pads serve as an electrical intermediary between the world outside of the integrated circuit 16 and the circuit itself. Small wires (not shown) interconnect the bonding pads 14 with the semiconductor circuit 16. Another set of small wires (also not shown) interconnect the bonding pads with external pins (not shown) in a ceramic, or dual-in-line package (DIP) for connecting the integrated circuit into a larger circuit.

Figure 3:
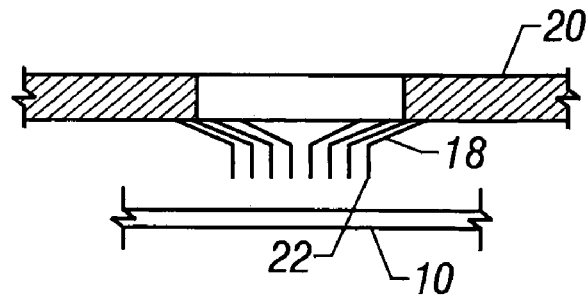
FIG. 3 is a sectional, schematic side elevation view of a probe card having a plurality of probe pins, and of a semiconductor wafer.

As shown in FIG. 3, the bonding pads also provide positions for electronic probe pins 18 on a semiconductor probe card 20 to contact the bonding pads. As is well known to those of ordinary skill in the art, the semiconductor probe card 20 is received in a prober machine (not shown) as well as is the semiconductor wafer 10 so that when the probe pins 18 are in contact with the bonding pads 14 a plurality of electronic tests can be performed on the semiconductor circuit 16.

As is also well known to those of ordinary skill in the art, it is common for the probe card pins 18 to become misaligned during use. Once the misalignment has exceeded predetermined tolerances, the probe card must be reworked and/or remanufactured to bring the tips 22 of the probe pins back into planarity, as well as back into horizontal registration with respect to one another, and with respect to the probe card 20. For this purpose, a variety of machines known as probe card analyzers 70 have been constructed in which a relatively hard testing surface often termed a "check plate" is positioned in place of the semiconductor wafer 10. The check plate may have a very hard transparent window manufactured from sapphire or another synthetic crystal, or may be constructed from a tool hardened steel having various electrical discontinuities thereon so that the horizontal positioning of the respective pin tips 22 may be measured with respect to one another and with respect to the probe card. It is common during such testing that probe pins are over-traveled in the vertical (i.e. "Z") direction and will "scrub" along the surface of the check plate. As best seen in dashed lines in FIG. 4 at reference number 24, a probe card analysis scrub pattern has a well defined starting or "touch down" point 26 and a well defined end of travel point 28. Unfortunately, due to the hardness of the check plate surface, this scrub pattern does not match a corresponding scrub mark 30 shown in solid lines in FIG. 4 made in an actual bonding pad or test wafer. Scrub mark 30 can be electronically imaged 72 by an appropriate scrub mark analysis machine 74. The starting or touch down point 32 of the scrub mark in an aluminized surface such as a semiconductor die bonding pad is difficult to discern because the probe pin 18 is applying relatively little force to the aluminized surface. In fact, the touch down point on the aluminized surface should be where the touch down point 26 is shown when the same probe touches down on a probe card analysis check plate. However, the probe "skates" along the surface of the aluminized bonding pad before it begins to make a discernable mark, and the distance between the touch down point 26 as measured by the probe card analysis machine 70, and the touch down point 32 as measured by the scrub mark analysis machine 74 has been termed by the Applicant as "skating distance" 34.

Similarly, the end of travel 36 of the probe tip in either an aluminized bonding pad, or the surface of a test wafer in a scrub mark analysis machine 74 falls short of the end of travel point 28 as indicated by the probe card analysis machine 70. This is because shortly after the probe touches down at touch down point 32, the probe tip digs into the aluminized surface of the bonding pad as a plow enters the ground. The coefficient of friction between the probe pin tip and the bonding pad quickly rises. As a result thereof, the probe "stubs" into the metalized surface when the force due to friction equals the forward force applied by the prober machine through the probe pin. The distance between the end of travel point 36 as measured by the scrub mark analysis machine 74 and the end of travel point 28 measured by the probe card analysis machine 70 has been defined by the Applicant as the "stubbing" distance 38.

It is apparent that in predicting the behavior of a probe card pin on a semiconductor bonding pad, it is the probe card analysis machine touch down point 26 and scrub mark analysis machine end of travel point 36 which are of principal interest to the operators of semiconductor prober machines. That is, it is undesirable to have the probe card pin touch down outside of the bonding pad area onto the soft passivation layer of the semiconductor die (and also in violation of various military standards for semiconductor products). It is also undesirable to have the probe pin 18 severely deformed by excessive stubbing represented by stubbing distance 38 so as to put either excessive pressure on the bonding pad such as to damage the pad or bend the pin. In addition, it is highly desirable, as shown in FIG. 5, to determine the source of errors in a probe card and prober machine combination which may be due to errors in the prober machine itself.

FIG. 5 schematically illustrates a series of bonding pads on a semiconductor die having scrub marks left by a probe card/prober combination. As shown in FIG. 5(a), all of the scrub marks are substantially centered in the pads as is desired. FIG. 5(b) illustrates that either the probe pins, or more likely the prober machine itself, has offset the pins in the negative X direction. FIG. 5(c) illustrates the situation in which the prober machine probably has an offset in the positive Y direction. FIG. 5(d) illustrates that the probe card has been rotated about the Z-axis in a clockwise direction, or the pins have been twisted in that direction. FIG. 5(e) illustrates excessively long scrub marks in both the X and Y directions, indicating that the prober is probably exerting too much force on the probe pins. Conversely, FIG. 5(f) has small scrub marks which are not elongated, indicating that insufficient pressure is being applied in the Z direction by the prober machine. FIG. 5(g) shows elongated scrub marks on the left hand side of the die, and very short scrub marks on the right hand side of the die. This configuration indicates a pitch error about the Y axis. FIG. 5(h) indicates a roll error about the X-axis such that too much pressure is exerted on the probe pins in the upper portion of the die, and too little pressure is exerted on the pins in the lower portion of the die.

By combining scrub mark analysis data from the scrub mark analyzer 74 and scrub pattern data from the probe card analysis machine 70, it is possible to predict more accurately the behavior of a probe pin on a semiconductor die metalization pad, as well as isolate whether the source of errors in probe pin position is due to the prober machine, or the position of the probe pins with respect to the probe card itself.

Figure 4:
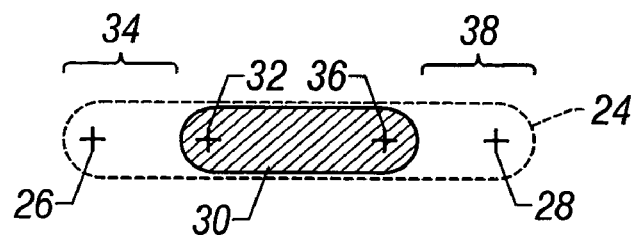
FIG. 4 is a schematic representation of a scrub mark analyzed by a scrub mark analysis machine, and a scrub pattern analyzed by a probe card analysis machine.
Figure 5A:
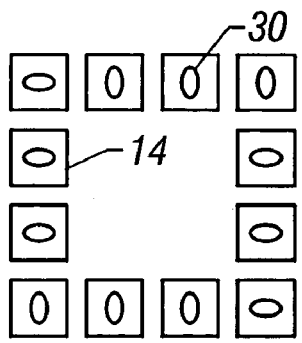
FIG. 5 (a through h) is a schematic representation of semiconductor die bonding pads having scrub marks thereon due to various probe card and/or prober machine errors.
Figure 5B:
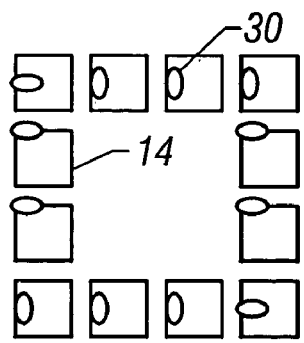
Figure 5C:
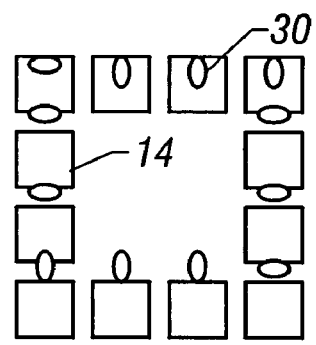
Figure 5D:
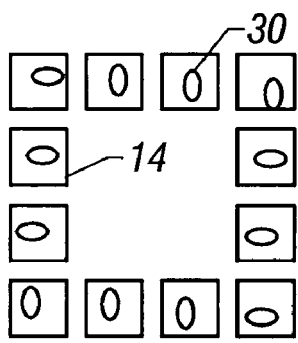
Figure 5E:
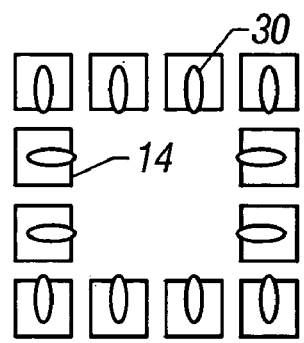
Figure 5F:
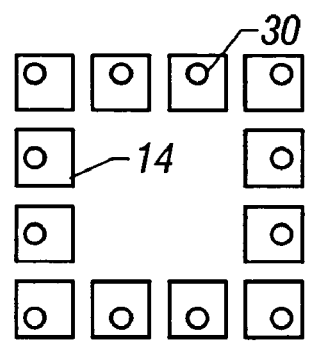
Figure 5G:
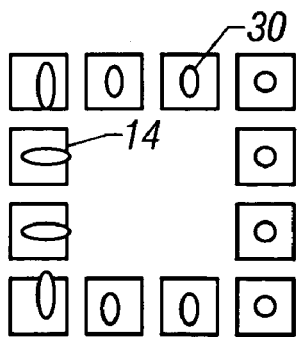
Figure 5H:
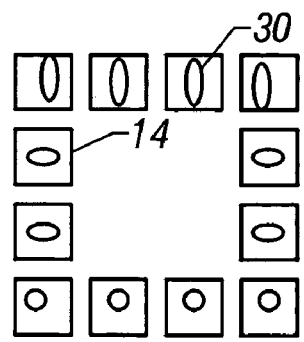
Figure 6:
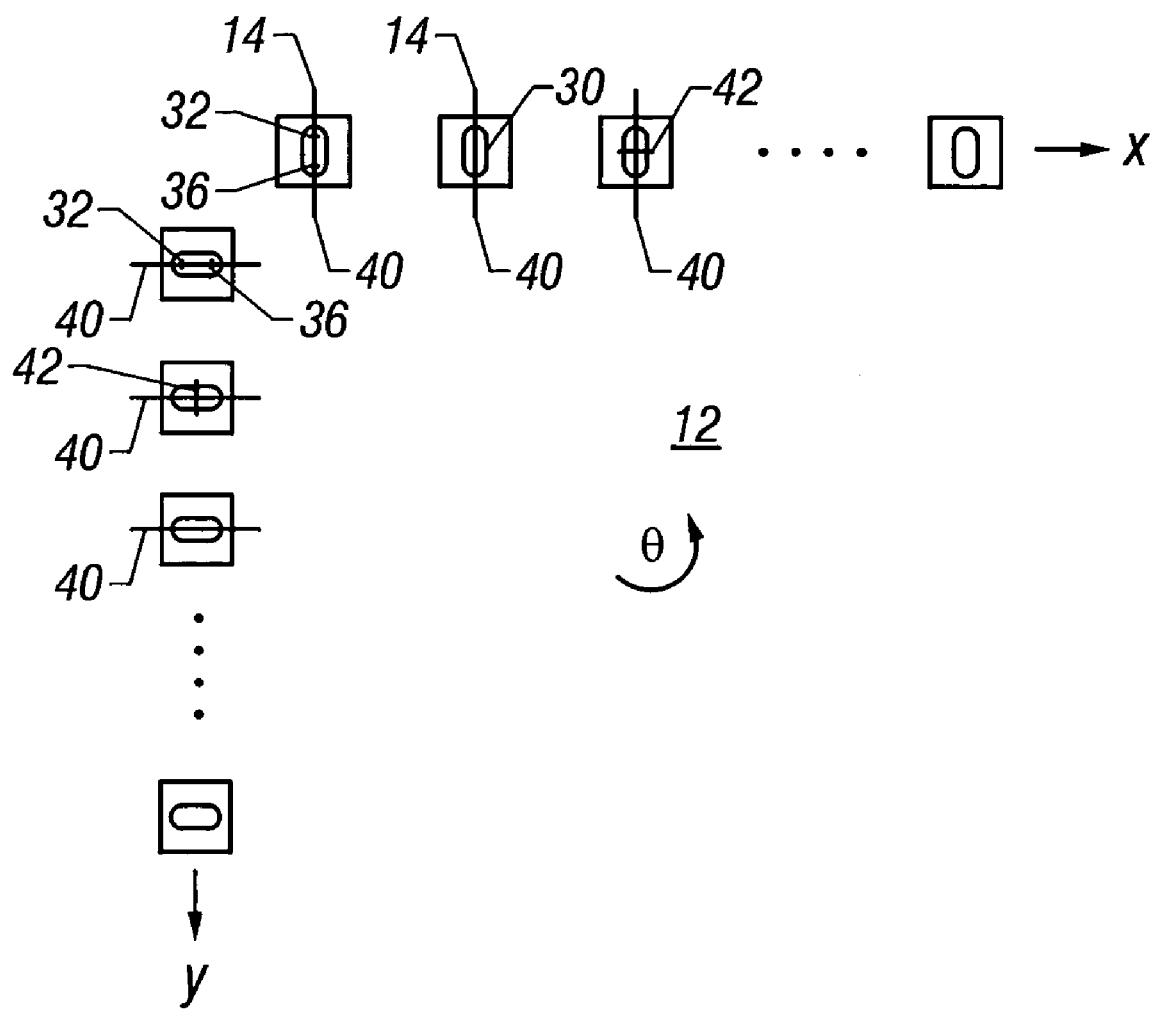
FIG. 6 is a schematic representation of one method of combining data sets.
Figure 7:
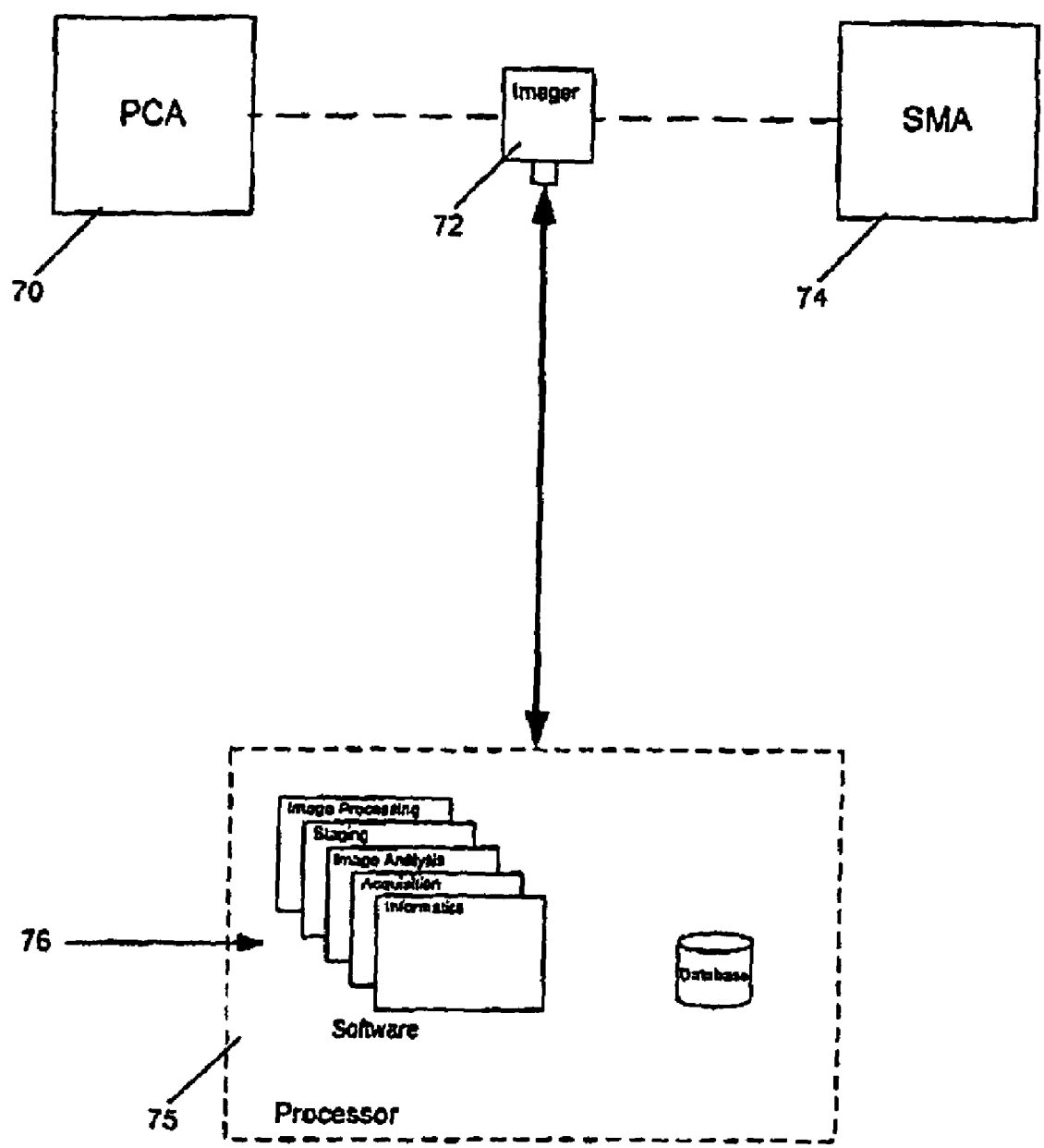
FIG. 7 is a block schematic representation of system for applying analyses of scrub mark morphology and location.

In a first embodiment of the invention, correction factors in the X, Y, and θ directions (left-right, up-down, and clockwise counterclockwise as shown in FIG. 6) are calculated so as to minimize differences in data sets relating to the stubbing distance 38 shown in FIG. 4. FIG. 6 illustrates a representative set of orthogonal bonding pads 14 on a semiconductor die surface 12 in the X and Y directions. The pads have scrub marks 30 such as are to be analyzed by a scrub mark analysis machine 74. In an iterative fashion, a correction factor in the X, Y and θ directions is added to a combined data set stored in a computer by a conventional computer program, such as the Excel database program available from Microsoft Corporation, Redmond, Washington. An error value is then associated with the stubbing distance 38 measured for each probe pin 18 associated with a bonding pad 14. As the X, Y and θ correction factors or "offset values" are incremented, a minimum error value represented by the stubbing distance 38 will be found. That minimum error value and the corresponding X, Y and θ offsets quantitatively represent the degree to which the probe card and prober machine combination are out of tolerance. The error value may be calculated by simple summation of the stubbing distance 38, as described above by averaging all of the stubbing distances for all of the pads; or by summing the squares of the differences between the average stubbing values and the differences between the end of travel positions between the probe card analysis machine 70 and scrub mark analysis machine 74; or, a standard deviation of the ending position differences between the scrub mark analysis and probe mark analysis machines. The specific numerical method which the artisan of ordinary skill uses is an inconsequential activity with respect to the claimed invention.

Alternatively, in a second embodiment of the invention, the error value may be associated with the skating distance 34 shown in FIG. 4. In this alternate embodiment of the invention, an error value may be assigned to the sum of the differences between the average skating distance 34 for all of the scrub marks 30 and the sum of the differences between the touch down points 26 and 32 as measured by the probe card analysis machine 70 and scrub mark analysis machine 74, respectively. As stated with respect to the first embodiment of the invention, a sum of the difference of the squares, or a standard deviation technique may also be used to define the error value. As stated with respect to the first embodiment, in this alternate embodiment correction factors in the X direction, Y direction and θ direction are incrementally applied to the measured locations of the touch down points correlating to the skating distance 34 until the error value is minimized. The correction factors in X, Y and θ thus relate to the degree to which the probe card and prober machine combination are out of tolerance.

In a third embodiment of the invention, the center of the scrub marks is defined by the scrub mark analysis machine 74 mathematically as a straight line between the touch down point 32 and end of travel point 36 measured by the scrub mark analysis machine 74 and a mathematical straight line between the touch down point 26 and end of travel point 28 as defined and measured by the probe card analysis machine 70. This scrub mark center line 40 can also be directly measured by the scrub mark analysis machine 74 from the left or right edge of the bonding pad 14 in the X-axis and the top or bottom edge of the bottom edge in the Y-axis as shown in FIG. 6. The error value can then be assigned as the sum of the absolute values of the center lines 40 with respect to the edge of their respective bonding pad or as the sum of the squares of those measurements. By incrementing correcting factors in the X, Y and θ directions, the minimum error value resulting from that incremental analysis gives the X, Y and θ correction factors which are representative to the degree to which the probe card and prober machine combination are out of tolerance.

In a fourth embodiment of the invention, the minor axis 42 of the scrub marks can be measured by both the scrub mark analysis machine 74 and the probe mark analysis machine 70 and the error factors applied as set forth above with respect to the third embodiment of the invention.

Furthermore, by comparing the data sets collected for the scrub patterns from the probe card analysis machine 70, the scrub marks from the scrub mark analysis machine 74, and the orientation of the errors as shown in FIG. 5, it can be determined whether the errors are due to misalignment of the probes with respect to the card, or the card with respect to the prober machine. These errors are particularly apparent where the dies being tested are located at the perimeter of the semiconductor wafer.

Finally, it is desirable to scrub the test wafer 10 in the probe machine with a hot chuck or other means for heating the wafer and the probe card 20 to the approximate operating temperature of an integrated circuit of a number of embodiments of the invention have been described.

Probe card data is generated by removing all prober errors from the scrub mark data set. Within the probe card data set, multiple probe card parameters are reported, based on the probe's scrub size, position, repeatability, and correlation patterns. Software 76 is used that has acquisition, staging, image processing, image analysis and informatics (database) components.

For each pad on the wafer, the pattern of scrub marks within each pad is analyzed and characterized in terms of length, width, orientation, and position relative to the pad. Information within a single die yields information about the quality of the probe card. Information between dies yields information about the prober itself, the wafer manufacturing process, and the environmental conditions of the fabrication and test facilities. In some probers, the probe card has the capacity to test more than one die at a time. In that case, the plurality of dies is referred as a dut. The present invention may also test duts as well as individual dies. In addition, a simple aluminized surface can be probed and the morphology and location of the scrub marks can be used to analyze the probe card and the prober system in the absence of an actual semiconductor wafer.

The scrub marks reveal a great deal about the entire manufacturing and testing process used in the fabrication facilities. By applying regression and clustering methodologies to the study of patterns of scrub marks, a number of parameters can be deduced from the images.

It will be understood that various modifications may be made without departing from the spirit and scope of the invention. Accordingly, other embodiments are within the scope of the following claims.

What is claimed is:

1. An opto-mechanical workstation for loading and systematically moving wafers and for imaging and analyzing scrub marks; said workstation comprising:
    a probe card analyzer;
    a scrub mark analyzer;
    an imaging apparatus configured and operative to obtain images of first scrub marks made by probe card pins on a check plate in said probe card analyzer and images of second scrub marks made by said probe card pins on bonding pads in said scrub mark analyzer; and
    a data processor coupled to said imaging apparatus and configured and operative to obtain scrub mark data associated with said first scrub marks and scrub pattern data associated with said second scrub marks and to analyze said scrub mark data and said scrub pattern data; wherein said data processor allows prediction of the behavior of a probe pin on a semiconductor die metalization pad.

* * * * *